United States Patent
Fairgrieve et al.

(10) Patent No.: US 7,061,951 B2
(45) Date of Patent: Jun. 13, 2006

(54) SYSTEMS AND METHODS FOR AUTOMATIC POWER CONTROL OF LASER DIODES

(75) Inventors: Alexander Fairgrieve, Menlo Park, CA (US); D. Stuart Smith, San Jose, CA (US); Theodore D. Rees, Mountain View, CA (US); Bill R. Tang, San Jose, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 455 days.

(21) Appl. No.: 10/612,579

(22) Filed: Jul. 2, 2003

(65) Prior Publication Data

US 2004/0120369 A1   Jun. 24, 2004

Related U.S. Application Data

(60) Provisional application No. 60/435,678, filed on Dec. 20, 2002.

(51) Int. Cl.
*H01S 3/00* (2006.01)

(52) U.S. Cl. .............................. 372/38.02; 372/38.01; 372/38.07

(58) Field of Classification Search ............. 372/38.02
See application file for complete search history.

(56) References Cited

U.S. PATENT DOCUMENTS

| 4,796,266 A | 1/1989 | Banwell et al. |
| 4,856,011 A | 8/1989 | Shimada et al. |
| 4,916,706 A * | 4/1990 | Ohashi ........................ 372/31 |
| 5,422,900 A | 6/1995 | Reele et al. |
| 5,485,300 A * | 1/1996 | Daley ........................ 398/197 |
| 5,878,015 A | 3/1999 | Schell et al. |
| 6,151,344 A * | 11/2000 | Kiely et al. .............. 372/38.02 |
| 6,359,847 B1 | 3/2002 | Shimizu |
| 6,414,932 B1 | 7/2002 | Kaku et al. |
| 6,442,118 B1 | 8/2002 | Hoshino et al. |
| 6,483,791 B1 | 11/2002 | Asada et al. |
| 6,487,154 B1 | 11/2002 | Kurebayashi et al. |

FOREIGN PATENT DOCUMENTS

| EP | 0497431 A1 | 8/1992 |
| WO | WO01/57969 A1 | 8/2001 |

* cited by examiner

*Primary Examiner*—Armando Rodriguez
(74) *Attorney, Agent, or Firm*—Fliesler Meyer LLP

(57) ABSTRACT

Methods and system are provided for automatic power control of a laser diode, e.g., in a laser driver. In accordance with an embodiment of the present invention, a power controller includes a detector circuit adapted to detect the output of the laser diode and to produce a measured output therefrom. A comparator compares a desired output to the measured output, and produces an error signal therefrom. The error signal is provided to an integrator circuit that produces an integrated error signal. At least one digital-to-analog converter (DAC) uses the integrated error signal to produce a current drive signal that drives the laser diode.

23 Claims, 4 Drawing Sheets

SYSTEMS AND METHODS FOR AUTOMATIC POWER CONTROL OF LASER DIODES

This application claims the priority of U.S. Provisional Patent Application No. 60/435,678, entitled "Systems and Methods for Automatic Power Control of Laser Diodes," which was filed Dec. 20, 2002.

FIELD OF THE INVENTION

The present invention relates to laser drivers, and more specifically to power control for laser drivers.

BACKGROUND

Laser drivers are used to drive laser diodes within various types of information recording/reproducing apparatuses, such as DVD and CD drives, DVD camcorders, and DVD video recorders. Typically, a laser driver provides a current to a laser diode, causing the laser diode to output a light signal that is incident on an a optical media disk. The magnitude of the current provided by the laser driver (which controls the output power of the laser diode) may vary depending on whether the laser diode is being used to read data from or write data to the media. Further, the magnitude of the current may also depend on specific disc media, DVD or CD standards, and/or the speed at which data is being read or written.

Laser drivers are carefully calibrated so that the power or intensity of the light signal (produced by the laser diode) can be accurately controlled. Nevertheless, environmental variations (such as temperature variations) and aging of the laser diode may affect the characteristics (e.g., slope efficiency) of the laser diode. Accordingly, there is a need to accurately control the power or output of a laser diode to compensate for changes in the laser diode's characteristics. Embodiments of the present invention provides improved methods and systems for controlling the power of a laser diode.

SUMMARY OF THE INVENTION

Embodiment of the present invention provide methods and systems for automatic power control of a laser diode, e.g., in a laser driver. In accordance with an embodiment of the present invention, a power controller includes a light detector circuit adapted to detect the output of the laser diode and to produce a measured output therefrom. One or more comparators compare a desired output to the measured output, and produces error signals therefrom. One or more of the error signals are used to adjust an integrator circuit. In accordance with an embodiment of the present invention, the integrator circuit is implemented using an up-down counter, which is adapted to count up or down based on an error signal, and to output count signals. Alternatively, the integrator circuit can be implemented using analog components. At least one digital-to-analog converter (DAC) uses the output of the integrator circuit to produce a current drive signal that drives the laser diode.

Further embodiments, and the features, aspects, and advantages of the present invention will become more apparent from the detailed description set forth below, the drawings and the claims.

DETAILED DESCRIPTION

Figure 1:
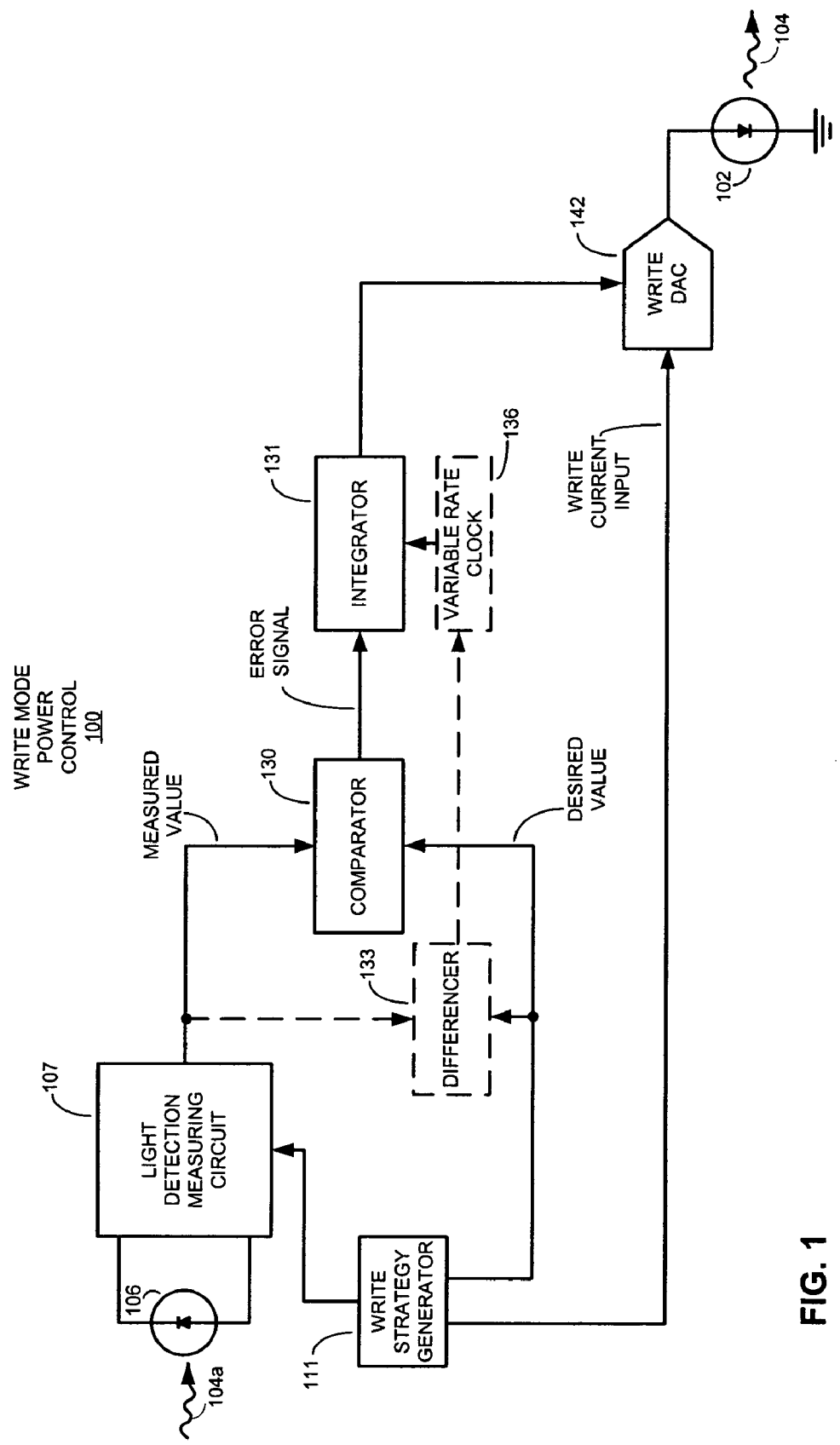
FIG. 1 is a high level diagram of a write power controller, used during write mode, according to embodiments of the present invention.

FIG. 1 illustrates a power control portion 100, of a laser driver, used to compensate for the laser efficiency during write operation (also referred to as write mode). Accordingly, power control portion 100 is also referred to as write power controller 100, or laser efficiency compensator 100. Referring to FIG. 1, the power controller 100 includes a laser diode 102, which outputs a light signal 104, and a power monitor photodetector diode 106, which receives a portion 104a of the light signal 104.

A write strategy generator 111 implements an appropriate write strategy (which may depend, for example, on the media, DVD or CD standards, and/or speed being supported) by specifying an appropriate write current and a desired write power (also referred to as the desired value). A write current input is provided to a WRITE DAC 142, which drives the laser diode 102, causing the laser diode 102 to produce the light signal 104. The light signal 104 is split (e.g., by a beam splitter) such that a majority of the light signal is directed toward the media, and a small portion of the light signal (shown as 104a) is directed toward the monitoring photodetector diode 106. The monitoring photodetector diode 106 detects the light signal 104a and outputs a photo-current signal. The photo-current signal is measured by a light detection measuring circuit 107, which outputs a measured value signal. A comparator 130 compares the measured value to the desired value.

The comparator output (i.e., the error signal) is provided to an integrator circuit 131, which can be implemented using digital and/or analog components. The integrator circuit 131 integrates the error signal. The integrated error signal is provided as a reference input to the WRITE DAC 142, and acts as a multiplication factor for the WRITE DAC 142. In this manner, when the measured value is greater than the desired value, the output of the integrator circuit 131 will decrease, causing the WRITE DAC drive current (provided to the laser diode 102) to decrease. This will cause the power of the light signal 104 to decrease, and the measured value to move down toward the desired value. Conversely, when the measured value is less than the desired value, the output of the integrator circuit 131 will increase, causing the WRITE DAC drive current (provided to the laser diode 102) to increase. This will cause the power of the light signal 104 to increase, and the measured value to move up toward the desired value. It should be understood that the light signal 104a increases and decreases as light signal 104 increases and decreases.

In accordance with an embodiment of the present invention, the output of the comparator 130 (provided to the integrator 131) is the difference between the measured value and the desired value, along with the polarity of the difference. In accordance with another embodiment of the present invention, the output of the comparator 130 is either a HIGH or LOW signal.

In accordance with an embodiment of the present invention, a further comparator or differencer 133 receives the measured value and the desired value and outputs the difference between the two values, which is provided to a variable rate clock 136. The magnitude of the difference between the two values causes the clock to increase in speed or decrease in speed, with an output of the variable rate clock 136 controlling the speed of the integrator 131. If the comparator 130 outputs a difference signal, then the further differencer 133 is not needed because the output of comparator 130 can be provided to the variable rate clock 136.

Figure 2:
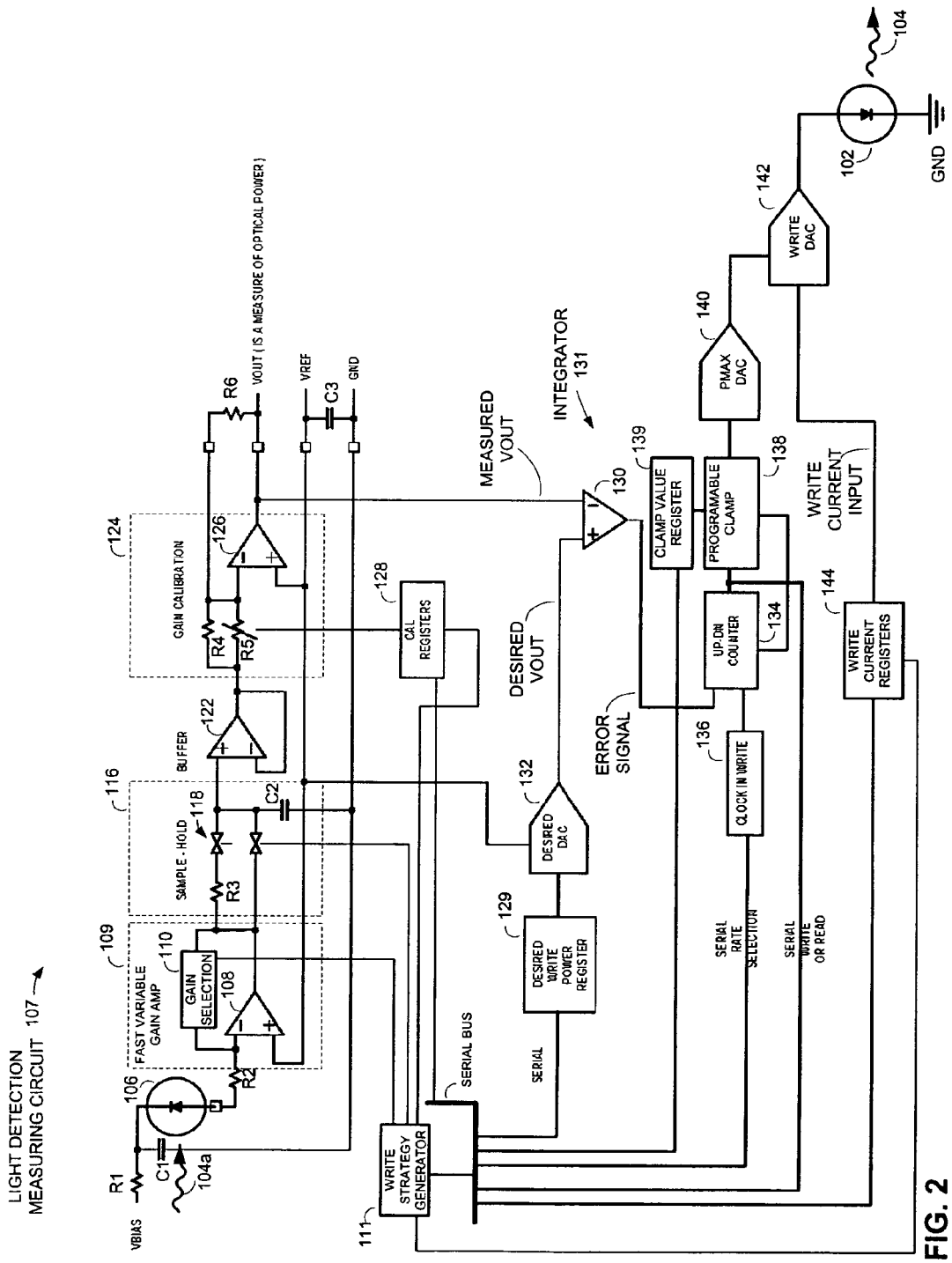
FIG. 2 is a more detailed diagram of the write power controller shown in FIG. 1, according to an embodiment of the present invention.

FIG. 2 shows additional details of the write power controller 100, according to an embodiment of the present invention. In this embodiment, the photodetector diode 106 is shown as being biased by a bias voltage VBIAS (e.g., 5 V) to achieve a desired speed. The photo-current, which varies depending on the intensity of the received light signal 104a (i.e., the greater the intensity, the greater the current) flows through an optional resistor R2 (which is used for power supply filtering or decoupling). In this embodiment, the light detection measuring circuit 107 is shown as including a fast variable gain amplifier stage 109, a sample-and-hold stage 116, a buffer stage 122 and a gain calibration stage 124, each of which is discussed below.

The photo-current is provided to the fast variable gain amplifier stage 109, which is shown as including an operational amplifier 108 and a gain selection block 110. In the embodiment shown, the photo-current is provided to an inverting input of the operational amplifier 108. A reference voltage VREF (e.g., 2.5 V) is provided to the non-inverting input of the operational amplifier 108. Other amplifier forms could be used. In the embodiment shown, the write strategy generator 111 controls the gain of the fast variable gain amplifier stage 109 by selecting a gain of block 110. An RC filter, including a resistor R1 and a capacitor C1, prevents noise of the bias voltage VBIAS from affecting the gain the fast variable gain amplifier stage 109. A capacitor C3, connected between VREF and ground GND, provides a decoupling capacitance to keep VREF quiet.

An output of the operational amplifier 108 is provided to the sample-and-hold stage 116. The sample-and-hold stage 116, in accordance with an embodiment, includes a hold capacitor C2, an averaging resistor R3, and a pair of switches 118. The write strategy generator 111 controls sample timing by triggering one of the two switches 118 in order to sample the output of the operational amplifier 108. The switch 118 corresponding to the averaging resistor R3 is asserted to produce average samples, due to the RC circuit including R3 and C2. The other switch 118 is asserted to produce faster (i.e., non-averaged) samples. An optional operational amplifier 122, with its non-inverting amplifier tied to its output, acts as a buffer to prevent the voltage stored on the hold capacitor C2 from leaking down. The output of the operational amplifier 122 maybe referred to as a sampled signal.

The sampled signal is provided to the gain calibration stage 124. The gain calibration stage 124 is relatively slow and holds the calibration, while the faster activity occurs in the fast variable gain amplifier stage 109. The gain calibration stage 124, in accordance with an embodiment, is shown as including resistors R4, R5, R6 and an operational amplifier 126. The pair of resistors R4 and R5 are connected in parallel (with respect to one another) between the output of the operational amplifier 122 and the inverting input of the operational amplifier 126. The resistor R6 is connected between the output of the operational amplifier 126 and the inverting input of the operational amplifier 126. Resistor R5 is a variable resistor whose resistance is specified by a selected one of a plurality of calibration registers 128. An appropriate one of the calibration registers 128 is selected by the write strategy generator 111 to match the gain selected for the fast variable gain amplifier 109. The voltage output from the gain calibration stage 124, also referred to as measured VOUT, is representative of the measured power output of laser diode 102 during write mode. The above described details of stages 109, 116, 122 and 124 have been provided as an exemplary implementation. One of ordinary skill in the art would appreciate that the implementation of these stages can be altered, while still being within the spirit and scope of the present invention.

The measured voltage output VOUT is provided to an input of the comparator 130. Another input of the comparator 130 receives an output from a digital-to-analog converter (DAC) 132, which is referred to as the DESIRED DAC because it specifies a desired voltage output (i.e., a desired VOUT) for the specific write strategy of the laser driver. The output of the DESIRED DAC 132 is specified by a value in the desired write power register 129 (e.g., which provides a parallel multibit digital input to the DESIRED DAC 132) and by a fixed reference input, which is VREF. If the multi-bit digital input to the DESIRED DAC 132 consists of all zeros (e.g., 00000000), then the output of the DESIRED DAC 132 will equal VREF (i.e., desired VOUT will equal VREF). When the multi-bit input to the DESIRED DAC 132 has a value (other than all zeros), the output of the DESIRED DAC (i.e., desired VOUT) will have an amplitude greater than VREF, which is relative (e.g. proportional) to a magnitude of the multi-bit digital input. The value in the desired write power register 129 can be defined by a serial input, as shown, provided by the write strategy generator 111.

In this embodiment, the output of the comparator 130 (also referred to as the comparator output, error signal or an up/down signal) is HIGH or LOW depending on whether the measured VOUT is below or above the desired VOUT. The error signal is provided to the integrator circuit 131, which in this embodiment is shown as including a digital up-down counter 134, which counts up or down, depending on whether the error signal is HIGH (e.g., 3.3 V) or LOW (e.g., 0 V). For example, if the measured VOUT is greater than the desired VOUT, the output of the comparator 130 will be LOW, and the up-down counter 134 will count down. If the measured VOUT is less than the desired VOUT, the output of the comparator 130 will be HIGH, and the up-down counter 134 will count up. In the just described manner, the up-down counter functions as an integrator.

The up-down counter 134 also receives a clock input from a clock 136. The clock rate of the clock 136 can be specified, for example, by a serial rate selection input received from the write strategy generator 111. The rate of the clock signal provided to the up-down counter specifies how fast the up-down counter counts 134 (up or down), and thereby specifies the bandwidth of the control loop of which the up-down counter 134 is a part. It is further noted that the clock 136 of the write power controller 100 can also be a variable rate clock that receives an error signal and/or VOUT, to thereby also function similar to an analog RC integrator circuit.

The digital output of the up-down counter 134 (also referred to as the count output) is provided to an optional programmable clamp 138. The programmable clamp 138 prevents the count output from exceeding a predetermined maximum value, thereby preventing the laser diode 102 from exceeding its operating range and being damaged. The maximum value is stored in a clamp value register 139, which can be loaded as a serial input from the write strategy generator 111. The output of the programmable clamp 138 is equal to its input (which is the count output), so long as its input is less than or equal to the maximum value. If the count output exceeds the maximum value, then the output of the programmable clamp 138 will be equal to the maximum value. The programmable clamp 138 can accomplish this, for example, by stopping the up-down counter 134 from counting up beyond the maximum value. The digital output of the up-down counter 134 (i.e., the counter output) can also be used as feedback that is provided to monitoring software, firmware, and/or hardware. Other signals can also be provided to software, firmware and/or hardware (not shown) for various monitoring and feedback purposes.

The output of the programmable clamp 138 (which is the counter output) is provided to a PMAX DAC 140. The PMAX DAC 140 converts the digital input to an analog output (referred to simply as PMAX), which is applied to the reference input of the WRITE DAC 142. The WRITE DAC 142 is a multiplier type DAC, with PMAX specifying a multiplication factor. More specifically, the output of the WRITE DAC 142 is proportional to a multi-bit digital write value (applied by one of registers 144) multiplied by the reference input (i.e., PMAX). For example, the output of the WRITE DAC may equal the product of the multi-bit digital input value (from one of registers 144), multiplied by PMAX, further multiplied by a constant.

As shown, the output of the WRITE DAC 142 drives the laser diode 102. Assuming, for example, that the WRITE DAC 142 is an 8 bit-DAC (and thus, that the multi-bit digital input from registers 144 contains 8 bits), then for each value of PMAX, the laser diode 102 would have 256 potential different outputs (i.e., $2^8=256$). As PMAX changes, the 256 potential different outputs change accordingly. In this manner, PMAX is used in the control of the output of the laser diode 102 during write operation. Another way of looking at it is that the input to the PMAX DAC 140 (i.e., the output of the up-down counter 134) is used to compensate for the change in laser efficiency.

Summarizing the embodiment of FIG. 2, the WRITE DAC 142 drives the laser diode 102, causing the laser diode 102 to produce the light signal 104. The monitoring photodetector diode 106 detects the light signal 104$a$ and outputs a photo-current signal. The photo-current signal is amplified, sampled and calibrated by the fast variable gain amplifier stage 109, the sample-and-hold stage 116, buffer 122, and gain calibration stage 124, resulting in a measured VOUT signal. One of ordinary skill in the art will appreciate that alternative signal conditioning and sampling circuits can be used to produced a measured VOUT, while still being within the spirit and scope of the present invention.

The comparator 130 compares the measured VOUT to the desired VOUT, provided by the DESIRED DAC 132. The comparator output (i.e., the error signal) is fed to the up-down counter 134. The up-down counter 134 counts up or down based on the error signal. The digital output of the up-down counter 134 is provided, through the programmable clamp 138, to the PMAX DAC 140. As can be appreciated from this summary, the PMAX DAC output (i.e., PMAX) is a function of the count value. The greater the count value, the greater PMAX. The lower the count value, the lower PMAX. If the error signal is LOW (i.e., if the measured VOUT is greater than the desired VOUT), then the count value is reduced and PMAX is reduced. If the error signal is HIGH (i.e., if the measured VOUT is less than the desired VOUT), then the count value is increased and PMAX is increased.

PMAX is provided as the reference input to the WRITE DAC 142, and acts as a multiplication factor for the WRITE DAC 142. In this manner, when the measured VOUT is greater than the desired VOUT, the counter value and PMAX will decrease, causing the WRITE DAC drive current (provided to the laser diode 102) to decrease. This will cause the power of the light signal 104 to decrease, and the measured VOUT to move down toward the desired VOUT. Conversely, when the measured VOUT is less than the desired VOUT, the counter value and PMAX will increase, causing the WRITE DAC drive current (provided to the laser diode 102) to increase. This will cause the power of the light signal 104 to increase, and the measured VOUT to move up toward the desired VOUT.

Figure 3:
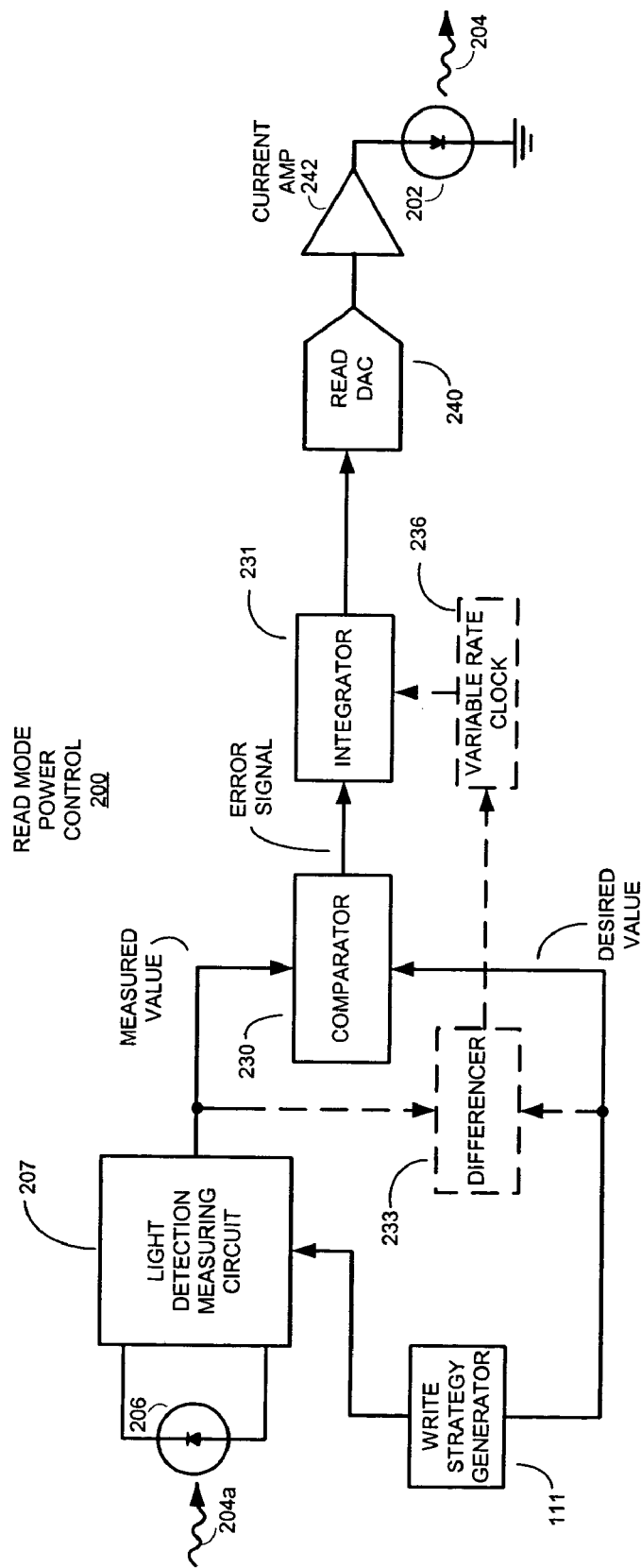
FIG. 3 is a high level diagram of a read power controller, used during read and write mode, according to embodiments of the present invention.

FIG. 3 illustrates a power control portion 200 of a laser driver used during read operation (also referred to as read mode) and write operation. The power control portion 200 is also referred to as read power controller 200.

In accordance with an embodiment of the present invention, the power control portion 100 and power control portion 200 are included in the same device (i.e., in the same laser driver). In such an embodiment, the same laser diode and monitoring photodetector diode maybe shared among the write power control portion 100 and the read power control portion 200 (i.e., laser diode 102 and photodetector diode 106, can be the same, respectively, as laser diode 202 and photodetector diode 206). The remaining circuitry is preferably (although not necessarily) different for the power control portion 100 and the power control portion 200. This enables fast switching back and forth between the two power control portions 100 and 200, which may be important when switching back and forth between reading and writing.

Referring to FIG. 3, a READ DAC 240 and amplifier 242 drives the laser diode 202, causing the laser diode to produce a light signal 204. The light signal 204 is split (e.g., by a beam splitter) such that a majority of the light signal is directed toward the media, and a small portion of the light signal (shown as 204$a$) is directed toward a monitoring photodetector diode 206. The monitoring photodetector diode 206 detects the light signal 204$a$ and produces a photo-current signal. The photo-current signal is measured by a light detection measuring circuit 207, which outputs a measured value signal.

A comparator 230 compares the measured value to a desired value, which is specified by the write strategy generator 111. The comparator output (i.e., the error signal) is fed to the an integrator circuit 231. The output of the integrator circuit 231 is provided to the READ DAC 240. If the error signal is LOW (i.e., if the measured value is greater than the desired value), then the output of the integrator circuit 231 (which is provided to the READ DAC 240) is reduced. This will cause the power of light signal 204 to decrease, and the measured value to move down toward the desired value. If the error signal is HIGH (i.e., if the measured value is less than the desired value), then the output of the integrator 231 is increased. This will cause the power of the light signal 204 to increase, and the measured value to move up toward the desired value. If the integrator circuit 231 is a proportional integrator, then the magnitude of the error signal will effect the rate at which the measured value will move toward the desired value.

In accordance with an embodiment of the present invention, the output of the comparator 230 (provided to the integrator 231) is the difference between the measured value and the desired value, along with the polarity of the difference. In accordance with another embodiment of the present invention, the output of the comparator 230 is either a HIGH or LOW signal.

In accordance with an embodiment of the present invention, a further comparator or differencer 233 receives the measured value and the desired value and outputs the difference between the two values, which is provided to a variable rate clock 236. The magnitude of the difference between the two values causes the clock to increase in speed or decrease in speed, with an output of the variable rate clock 236 controlling the speed of the integrator 231. If the comparator 230 outputs a difference signal, then the further differencer 233 is not needed because the output of comparator 230 can be provided to the variable rate clock 236.

Figure 4:
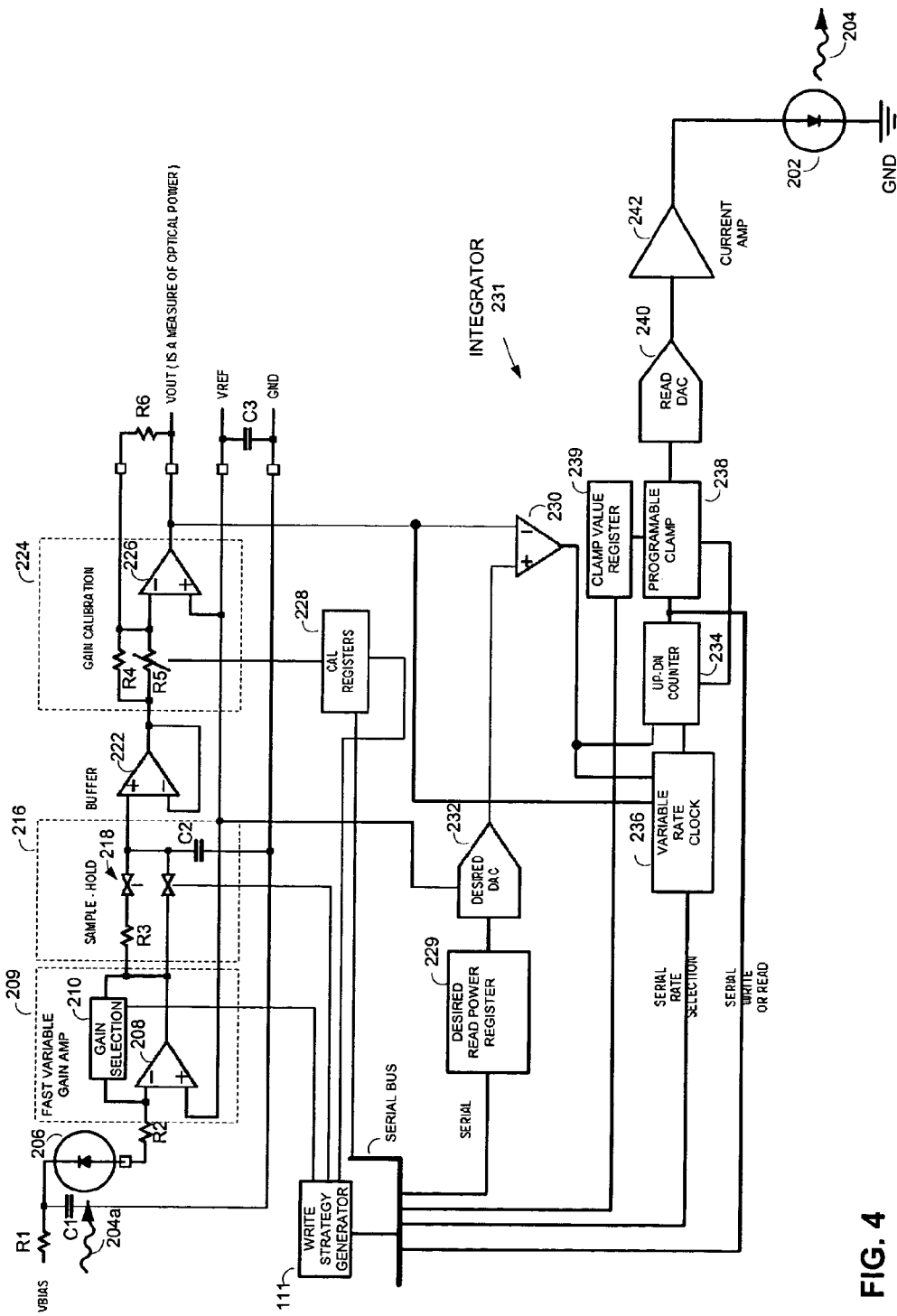
FIG. 4 is a more detailed diagram of the read power controller shown in FIG. 3, according to an embodiment of the present invention.

FIG. 4 shows additional details of the read power controller 200, according to an embodiment of the present invention. A comparison between FIG. 2 and FIG. 4 reveals that power monitor photo-diode circuit, the fast variable gain amplifier, the sample-and-hold stage, the buffer stage, and the gain calibration stage are essentially the same in power control portions 100 and 200. Accordingly, these circuits and stages are not discussed in detail again for FIG. 4. In accordance with an embodiment of the present invention, most if not all of these elements are shared for read power controller 200 and write power controller 100. Further, the actual gains, sample timing, and calibrations etc., selected will likely be different for power control portion 200, as compared to power control portion 100. This is because the power control portion 200 is used when the power is at read power, in contrast to the power control portion 100, which is used when the power is at write power.

Referring to FIG. 4, the measured voltage output VOUT is provided to an input of the comparator 230. Another input of the comparator 230 receives an output from a digital-to-analog converter (DAC) 232, which is referred to as the DESIRED DAC because it specifies a desired voltage output (i.e., a desired VOUT) for the specific write strategy of the laser driver. The output of the DESIRED DAC 232 is specified by a value in a desired read power register 229 (e.g., which provides a parallel multibit digital input to the DESIRED DAC 232) and by a fixed reference input, which is VREF. If the multi-bit digital input to the DESIRED DAC 232 consists of all zeros (e.g., 00000000), then the output of the DESIRED DAC 232 will equal VREF (i.e., desired VOUT will equal VREF). When the multi-bit input to the DESIRED DAC 232 has a value (other than all zeros), the output of the DESIRED DAC (i.e., desired VOUT) will have an amplitude greater than VREF, which is relative (e.g. proportional) to a magnitude of the multi-bit digital input. The value in the desired write power register 229 can be defined by a serial input, as shown, which can be based on the write strategy.

In this embodiment, the output of the comparator 230 (also referred to as the comparator output, error signal or an up/down signal) is HIGH or LOW depending on whether measured VOUT is below or above desired VOUT. The error signal is provided to an input of an up-down counter 234, which counts up or down, depending on whether the error signal is HIGH or LOW. The up-down counter 234 also receives a clock input from a variable rate clock 236. The variable rate clock 236 is shown as receiving VOUT and the error signal, and accordingly, the clock rate of the variable rate clock 236 can be dependent on VOUT and/or the error signal.

It is desirable that the rate of variable rate clock 236 increases or decreases based on the magnitude of the difference between desired VOUT and measured VOUT. Alternatively, the comparator output is provided to the variable rate clock 236, and it is assumed that the difference (between the desired VOUT and measured VOUT) is large when the error signal remains in the same state for a long time, thereby causing the clock rate to increase. Similarly, when the state of the error signal changes (from HIGH to LOW, or vice versa), the clock rate decreases. This enables the up-down counter to slew quickly in response to large difference between desired VOUT and measured VOUT, and to slew slowly in response to small difference between desired VOUT and measure VOUT. In accordance with an embodiment of the present invention, multiple comparators (not shown, each receiving measured VOUT and one of various scaled proportions of desired VOUT) could be used to make changes to the variable rate clock 236 dependent on the magnitude of the difference between desired VOUT and measured VOUT. In the above described manners, the variable rate clock 236, together with the up-down counter 232, can function similar to an analog RC integrator circuit. The clock rate can also be appropriately adjusted by a serial rate selection input, to set the overall bandwidth of the power controller 200 (e.g., a 100 KHz or 1 KHz bandwidth). It is further noted that the clock 236 of the read power controller 200 can also be a variable rate clock that receives an error signal and/or VOUT, to thereby also function similar to an analog RC integrator circuit.

The digital output of the up-down counter 234 (also referred to as the count output) is provided to an optional programmable clamp 238, which operates the same as the programmable clamp 138 discussed above. The digital output of the up-down counter 234 (i.e., the counter output), can also be used as feedback that is provided to monitoring software, firmware, and/or hardware.

The output of the programmable clamp 238 (which is the counter output) is provided to a READ DAC 240. The READ DAC can be, for example, a 10-bit or 12-bit monolithic non-glitching DAC. The READ DAC 240 converts the digital input to an analog current output. The analog current output of the READ DAC 240 can be provided to an optional current amplifier 242, which amplifies the current signal. The current signal drives the laser diode 202 during read operation. In this manner, the input to the READ DAC 240 (i.e., the output of the up-down counter 234) is used to control the output of the laser diode 202 during read operation. If desired, the current amplifier 242 can have a selectable gain, similar to pre-amplifier stage 207 or gain calibration stage 224.

In summary, the READ DAC 240 and amplifier 242 drives the laser diode 202, causing the laser diode to produce a light signal 204. The monitoring photodetector diode 206 detects the light signal 204a, and using the resistor R2, converts the detected intensity to a voltage signal. The voltage signal is conditioned and sampled to produce the measured VOUT signal.

A comparator 230 compares the measured VOUT to the desired VOUT, which is provided by the DESIRED DAC 232. The comparator output (i.e., the error signal) is fed to the up-down counter 234. The up-down counter 234 counts up or down based on the error signal. The digital output of the up-down counter 234 is provided, through the programmable clamp 238, to the READ DAC 240. As can be appreciated from this summary, the READ DAC output is a function of the count valve. The greater the count valve, the greater the laser diode drive current (i.e., the output of the READ DAC 240). The lower the count valve, the lower the laser diode drive current. If the error signal is LOW (i.e., if the measured VOUT is greater than the desired VOUT), then the output of the READ DAC 240 is reduced. This will cause the power of light signal 204 to decrease, and the measured VOUT to move down toward the desired VOUT. If the error signal is HIGH (i.e., if the measured VOUT is less than the desired VOUT), then the output of the READ DAC 240 is increased. This will cause the power of the light signal 204 to increase, and the measured VOUT to move up toward the desired VOUT. Further, the magnitude of the error signal will effect the rate at which the measured VOUT will move toward the desired VOUT. It should be understood that the light signal 204a increases and decreases as light signal 204 increases and decreases.

In accordance with specific embodiments of the present invention, a comparator and an up-down counter are used to implement a digital integrator, for use in a power control loop. The bandwidth of the power control loop can be specified by a clock rate provided to the up-down counter. The clock rate can be provided by a clock, which can be a variable rate clock. In accordance with embodiments of the present invention, the clock rate of the variable rate clock can affected by the error signal in the power control loop and/or the measured power. More specifically, the variable rate clock can provide a faster clock signal if the difference between the measured power and desired power is large, and a slower clock signal if the difference is small. In this manner, the variable rate clock, the up-down counter, and the comparator function as an analog RC integrator.

The drive current needs to exceed a threshold current before the laser diode begins lasing. This threshold current can be, for example, about 40 mA. After lasing starts, the laser diode has a high efficiency output in response to the applied drive current (e.g., about an 0.8 mW/mA efficiency). In read mode, only about 3 mW of power may be required (which correspond to about 4 mA). Since 4 mA is relatively small compared to 40 mA, the control loop of read power controller 200 essentially controls the laser threshold current, in both read and write modes. However, in accordance with an embodiment of the present invention, the read power controller 200 is only actively adapting the threshold current when it can take samples of the read power.

As mentioned above, the control loop of the write power controller 100 compensates for changes in laser efficiency. For example, the efficiency may drop from 0.8 mW/mA to 0.7 mW/mA. In this case, PMAX (i.e., the output of the PMAX DAC 240) would need to increase by 8/7th of its previous value. In accordance with an embodiment of the present invention, the write power controller 100 is only actively adapting PMAX when it can sample a power that is higher than the threshold power (associated with the threshold current). This can occur during write mode, and more specifically, when the laser diode is pulsed to the write power level that is to be sampled.

Various signals of the write power controller 100 and the read power controller 200 can be provided to software, firmware and/or hardware (not shown) that can analyze the signals and use the signals for improving overall system performance. For example, if the same laser diode is used for both read and write operations, information learned from the write power controller 100 can be provided to the read power controller 200, and vice versa. For a more specific example, the PMAX determined during write operation can be used to adjust gain and/or clock speeds in the read power controller 200.

In accordance with an embodiment of the present invention, the control loops of the write power controller 100 and the read power controller 200 are only active during sampling, and the control loop of the write power controller 100 does not sample during read mode because write power is not present during read mode. In addition, the feedback from the active one of counters 134 and 234 can be used to modify the inactive one of counters 134 and 234. For instance, if in read mode, when the counter value in counter 234 move up due to temperature, software/firmware can be used to increase the count in counter 134, even though no samples are present in that control loop.

Laser diodes and photodetectors are typically located on a pickup (also known as an optical head) of an information recording/reproducing apparatus. Conventionally, power control functions are performed on a main board that is connected to the pickup by a flexible cable (also simply known as a flex). More specifically, signals from a monitoring photodetector are typically sent down the flex to the main board, where a separate set of clock timers are located for sampling and power control. The main board includes complex and costly circuits that are required to compensate for delays caused by the distance the signals have to travel up and down the flex. In accordance with embodiments of the present invention, the above described power controllers are located on the pickup of an information recording/reproducing apparatus. This provides a significant cost reduction because it eliminates the need for high speed signals to be sent between the pickup and the main board for power control, and thus eliminates the need for the separate timers. Performing power control at the pickup should also enable higher speed activity to occur, because there is no need to coordinate signals running up and down the flex.

Embodiments of the present invention can be used to provide automatic power control for laser drivers within various types of information recording/reproducing apparatuses. Exemplary apparatuses include, but are not limited to, DVD and CD drives, DVD camcorders, and DVD video recorders. Embodiments of the present invention can also be used for fiber optic applications or optocoupler applications where it is important to control the power of emitted light. These are just a few exemplary applications for embodiments of the present invention, and are not meant to be limiting.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed:

1. A power control system for controlling the output of a laser diode, comprising:

a write strategy generator adapted to select a desired output from a plurality of different possible desired outputs;

a detector circuit adapted to detect at least a portion of the output of the laser diode and to produce a measured output therefrom;

a comparator adapted to compare a the selected desired output to the measured output, and to produce an error signal therefrom;

an integrator circuit adapted to integrate the error signal, and to produce an integrated error signal therefrom; and at least one digital-to-analog converter (DAC) adapted to use the integrated error signal to produce a current drive signal that drives the laser diode.

2. The system of claim 1, wherein the at least one DAC comprises a READ DAC that converts the integrated error signal to the current drive signal.

3. The system of claim 1, wherein the at least one DAC comprises a WRITE DAC that adjusts a write current input based on the integrated error signal.

4. The system of claim 1, wherein:
the integrated error signal comprises a count value;
the integrator circuit comprises
an up-down counter adapted to adjust the count value, up or down, based on the error signal; and
a variable rate clock adapted to provide a clock signal to the up-down counter, wherein an adjustable speed of the clock signal specifies a speed at which the up-down counter counts; and
the at least one DAC is adapted to use the count value to produce the current drive signal that drives the laser diode.

5. The system of claim 4, wherein the up-down counter counts down when the error signal indicates that the measured output, is greater than the desired output, and counts up when the error signal indicates that the measured output is less than the desired output.

6. The system of claim 4, further comprising:
a clamp adapted to prevent the count value from exceeding a maximum value.

7. The system of claim 4, wherein the variable rate clock is adapted to receive the error signal and to adjust the speed of the clock signal based on how long the error signal remains in a same state.

8. The system of claim 7, wherein:
the clock signal speeds up when the error signal remains in the same state; and
the clock signal slows down when the error signal changes state.

9. The system of claim 4, wherein the variable rate clock is adapted to receive the error signal and to adjust the speed of the clock signal based on a magnitude of the error signal.

10. The system of claim 4, wherein the variable rate clock is adapted to increase the speed at which the adjusting of the counter value occurs when the error signal remains in a same state, and to decrease the speed at which the adjusting of the counter values occurs when the error signal changes state.

11. The system of claim 4, wherein the variable rate clock is adapted to adjust the speed of the clock signal based on a magnitude of a difference between the desired output and the measured output.

12. The system of claim 4, wherein the speed of the clock signal can be adjusted to adjust the overall bandwidth of the power control system.

13. The system of claim 4, wherein the at least one DAC includes:
a PMAX DAC that receives the count signal and produces a reference input signal therefrom; and
a WRITE DAC that receives: both the reference input and a digital write current input, and produces the current drive signal therefrom.

14. The system of claim 4, wherein the at least one DAC includes:
a READ DAC that receives the count signal and produces the current drive signal therefrom.

15. The system of claim 14, further comprising:
a current amplifier that amplifies the current drive signal before the current drive signal is provided to the laser diode.

16. The system of claim 4, wherein the detector circuit includes:
a photodetector adapted to detect the at least a portion of the output of the laser diode, and to produce a photodetect current signal therefrom, wherein the photodetect current signal is used to produce the measured output.

17. The system of claim 1, further comprising:
a desired power register; and
a desired DAC;
wherein the write strategy generator selects the desired output from the plurality of different possible desired outputs by selecting one of a plurality of digital values stored in the desired power register; and
wherein the desired DAC is adapted to provide the selected desired output to the comparator in response to receiving the selected one of the digital values from the desired power register.

18. A method for controlling the output of a laser diode, comprising:
(a) selecting a desired output from a plurality of different possible desired outputs;
(b) detecting at least a portion of the output of the laser diode and producing a measured output therefrom;
(c) producing an error signal based on comparison between a the selected desired output and the measured output;
(d) integrating the error signal to produce an integrated error signal; and
(e) using the integrated error signal to produce a current that drives the laser diode.

19. The method of claim 18, wherein:
the integrated error signal comprises a counter value; and
step (d) comprises adjusting the counter value based on the error signal; and
step (e) comprises using the counter value to produce the current that drives the laser diode.

20. The method of claim 19, wherein the adjusting at step (d) includes increasing the speed at which the adjusting of the counter value occurs when the error signal remains in a same state; and decreasing the speed at which the adjusting of the counter values occurs when the error signal changes state.

21. The method of claim. 19, further comprising repeating steps (a) through (e) a plurality of times.

22. The method of claim 19, wherein the adjusting at step (d) includes:
increasing the speed at which the adjusting of the count value occurs, when the magnitude of a difference between the desired output and the measured output increases; and
decreasing the speed at which the adjusting of the count value occurs, when the magnitude of the difference between the desired output and the measured output signal decreases.

23. The method of claim 18, further comprising repeating steps (a) through (e) a plurality of times.

* * * * *